(12) United States Patent
Ominami et al.

(10) Patent No.: US 9,543,111 B2
(45) Date of Patent: Jan. 10, 2017

(54) CHARGED PARTICLE BEAM DEVICE

(75) Inventors: Yusuke Ominami, Hitachinaka (JP);
Sukehiro Ito, Hitachinaka (JP);
Masami Katsuyama, Hitachinaka (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 0 days.

(21) Appl. No.: 13/982,805

(22) PCT Filed: Nov. 2, 2011

(86) PCT No.: PCT/JP2011/006127
§ 371 (c)(1),
(2), (4) Date: Jul. 31, 2013

(87) PCT Pub. No.: WO2012/104942
PCT Pub. Date: Aug. 9, 2012

(65) Prior Publication Data
US 2013/0313430 A1  Nov. 28, 2013

(30) Foreign Application Priority Data
Jan. 31, 2011  (JP) .................................. 2011-017383

(51) Int. Cl.
*H01J 37/28* (2006.01)
*H01J 37/16* (2006.01)
(Continued)

(52) U.S. Cl.
CPC ................ *H01J 37/16* (2013.01); *H01J 37/18* (2013.01); *H01J 37/261* (2013.01); *H01J 37/28* (2013.01);
(Continued)

(58) Field of Classification Search
CPC ................. H01J 2237/2003; H01J 2237/2608; H01J 37/28
(Continued)

(56) References Cited

U.S. PATENT DOCUMENTS 4,607,167 A    8/1986  Petric
5,811,803 A    9/1998  Komatsu et al.
(Continued)

FOREIGN PATENT DOCUMENTS

DE         100 32 607 A1    1/2002
DE    10 2007 021 897 A1   11/2008
(Continued)

OTHER PUBLICATIONS

Communication dated Dec. 11, 2013, in connection with German Patent Application No. DE112011104347.3, 9 pages.
(Continued)

*Primary Examiner* — Wyatt Stoffa
*Assistant Examiner* — Eliza Osenbaugh-Stewar
(74) *Attorney, Agent, or Firm* — Baker Botts L.L.P.

(57) ABSTRACT

Provided is a charged particle beam device or charged particle microscope permitting observation of even a large-sized specimen in the air atmosphere or a gaseous atmosphere.
A charged particle beam device that adopts a thin film which partitions a vacuum atmosphere and the air atmosphere (or gaseous atmosphere) includes a charged particle optical lens barrel in which a charged particle optical system is stored, a housing in which a route along which a primary charged particle beam emitted from the charged particle optical lens barrel reaches the thin film is sustained in the vacuum atmosphere, and a mechanism that bears the charged particle optical lens barrel and first housing against a device installation surface. As the bearing mechanism, a housing having an opening through which a large-sized specimen is carried in or a mechanism having a shape other than the shape of the housing, such as, a post is adopted.

23 Claims, 6 Drawing Sheets

(51) Int. Cl.
*H01J 37/18* (2006.01)
*H01J 37/26* (2006.01)

(52) U.S. Cl.
CPC ... *H01J 2237/164* (2013.01); *H01J 2237/2608* (2013.01); *H01J 2237/2811* (2013.01)

(58) Field of Classification Search
USPC ....................................................... 250/310
See application file for complete search history.

(56) References Cited

U.S. PATENT DOCUMENTS

| | | | |
|---|---|---|---|
| 6,407,768 | B1 | 6/2002 | Ishikawa |
| 8,334,510 | B2* | 12/2012 | Shachal et al. ............... 250/310 |
| 2001/0052577 | A1 | 12/2001 | Aki et al. |
| 2002/0053638 | A1* | 5/2002 | Winkler ................ H01J 37/026 250/306 |
| 2004/0076529 | A1 | 4/2004 | Gnauck et al. |
| 2006/0011834 | A1 | 1/2006 | Nishimura et al. |
| 2008/0308731 | A1* | 12/2008 | Nishiyama .............. H01J 37/20 250/310 |
| 2009/0242763 | A1 | 10/2009 | Bijsse |
| 2009/0261251 | A1* | 10/2009 | Hayakawa ............ H01J 37/045 250/310 |
| 2010/0140470 | A1 | 6/2010 | Shachal |
| 2010/0224780 | A1* | 9/2010 | Spruck et al. ................. 250/309 |
| 2012/0025103 | A1* | 2/2012 | Deshmukh et al. ....... 250/491.1 |
| 2012/0241608 | A1* | 9/2012 | Shachal .................. H01J 37/20 250/307 |
| 2014/0361166 | A1 | 12/2014 | Shachal |
| 2015/0235806 | A1 | 8/2015 | Shachal |

FOREIGN PATENT DOCUMENTS

| | | |
|---|---|---|
| JP | 59-90926 A | 5/1984 |
| JP | 5-234552 | 9/1993 |
| JP | 2001-8083 | 1/2001 |
| JP | 2001-242300 A | 9/2001 |
| JP | 2003-263795 A | 9/2003 |
| JP | 2004-354309 A | 12/2004 |
| JP | 2005-108867 A | 4/2005 |
| JP | 2005-158338 A | 6/2005 |
| JP | 2006-147430 | 6/2006 |
| JP | 2007-188821 | 7/2007 |
| JP | 2007-294365 | 11/2007 |
| JP | 2008-210765 | 9/2008 |
| JP | 2009-245944 | 10/2009 |
| JP | 2010-509709 A | 3/2010 |
| WO | WO 2010/001399 A1 | 1/2010 |

OTHER PUBLICATIONS

Machine translation of JP 2006-147430.
English translation of communication mailed May 30, 2014, in connection with Korean Patent Application No. 10-2014-7005627; 7 pages; Korean Intellectual Property Office, Korea.
Notification of Reasons for Refusal, dated Sep. 8, 2015, which issued during the prosecution of Japanese Patent Application No. 2014-253586, which corresponds to the present application (English translation only).

* cited by examiner

CHARGED PARTICLE BEAM DEVICE

TECHNICAL FIELD

The present invention relates to a technology for a charged particle beam device.

BACKGROUND ART

In order to observe a microscopic region of an object, a scanning electron microscope (SEM) or transmission electron microscope (TEM) is employed. In general, in these devices, a second housing in which a specimen is disposed is evacuated in order to bring a specimen atmosphere to a vacuum state, and the specimen is then imaged. There is an intense need for observation of a specimen, which is damaged with vacuum or has the state thereof changed with vacuum, such as a biochemical specimen or liquid specimen using an electron microscope. In recent years, an SEM permitting observation of an object-of-observation specimen under the atmospheric pressure, a specimen retention device, or the like has been developed.

The foregoing devices have, in principle, a thin film or a microscopic through hole, which can transmit an electron beam, disposed between an electron optical system and a specimen so as to partition a vacuum state and atmospheric state. The devices have in common the thin film disposed between the specimen and electron optical system.

For example, patent literature 1 (Japanese Unexamined Patent Application Publication No. 2009-245944) has disclosed an invention of an environmental cell in which a specimen to be observed is stored in a petri dish-like cylindrical container having an aperture, through which an electron beam is passed, formed in the top side thereof, the cylindrical container is put in a second housing of an SEM, a hose is joined with the cylindrical container from outside the second housing, and the interior of the container can thus be sustained in the air atmosphere on a pseudo basis. Herein, the "pseudo basis" signifies that when the interior of the second housing is evacuated, since a gas flows out through the aperture, observation is not strictly performed under an atmospheric-pressure environment.

Patent literature 2 (Japanese Unexamined Patent Application Publication No. 2007-294365) has disclosed an atmospheric pressure SEM having an electron source side of an electron optical lens barrel oriented downward and an objective lens side oriented upward, and having a thin film, which can transmit an electron beam, formed over an exit hole for the electron beam at the distal end of the electron optical lens barrel with an O ring between them. According to an invention described in the literature, an object-of-observation specimen is placed directly on the thin film, a primary electron beam is irradiated from the undersurface of the specimen, and reflected electrons or secondary electrons are detected for SEM observation. The specimen is retained using an annular member disposed around the thin film. The atmospheric pressure SEM preferable for observation of, especially, a liquid specimen is realized by the invention disclosed in the patent literature 2.

Patent literature 3 (Japanese Unexamined Patent Application Publication No. 2007-188821) has disclosed an invention of a small-sized SEM, which permits SEM observation without use of a second housing by retaining a compact electron optical lens barrel in a shroud and overlaying the shroud undersurface with a vacuum seal material so as to bring the entire shroud into close contact with an object of observation, other than an invention of an atmospheric pressure SEM.

CITATION LIST

Patent Literature

[Patent literature 1] Japanese Unexamined Patent Application Publication No. 2009-245944 (U.S. Patent No. 2009/0242763)
[Patent literature 2] Japanese Unexamined Patent Application Publication No. 2007-294365
[Patent literature 3] Japanese Unexamined Patent Application Publication No. 2007-188821

SUMMARY OF INVENTION

Technical Problem

The related art described in the patent literature 1 or 2 is confronted with such a problem that a large-sized specimen cannot be observed. For example, in the case of the environmental cell disclosed in the patent literature 1, a specimen larger than the volume of the cell cannot be observed. In the case of the atmospheric pressure SEM disclosed in the patent literature 2, since a specimen is put in the annular member, the large-sized specimen cannot be put because of an issue of stability of the electron optical lens barrel. However, objects of observation of a charged particle microscope include a biomedical specimen and other numerous specimens that have to be observed without being cut. Therefore, realization of a device permitting observation of an object under the atmospheric pressure or in a gaseous atmosphere without the necessity of size adjustment is requested in earnest.

The present invention addresses the foregoing problem. An object of the present invention is to provide a charged particle beam device or charged particle microscope permitting observation of a large-sized specimen in the air atmosphere or a gaseous atmosphere.

Solution to Problem

The present invention provides a charged particle beam device adopting a thin film that partitions a vacuum atmosphere and an air atmosphere (or gaseous atmosphere). Herein, the charged particle beam device includes a charged particle optical lens barrel in which a charged particle optical system is stored, a housing in which a path along which a primary charged particle beam, which is emitted from the charged particle optical lens barrel, reaches the thin film is sustained in a vacuum atmosphere, and a mechanism that bears the charged particle optical lens barrel and a first housing against a device installation surface. A housing which has an opening through which a large-sized specimen is carried in, or a mechanism, which has a shape other than that of the housing, such as a post is adopted as the bearing mechanism, whereby the aforesaid problem is solved. The length of the path along which the primary charged particle beam having passed through the thin film reaches the specimen is adjusted using an appropriate means.

Advantageous Effects of Invention

Even a very large specimen can be observed with a charged particle beam under the atmospheric pressure or in a gaseous atmosphere. In addition, a charged particle beam device capable of changing an object-of-observation position of a specimen without damaging a thin film during observation can be realized.

DESCRIPTION OF EMBODIMENTS

A description will be made below by taking for instance an SEM that uses an electron beam. Needless to say, the description can be applied to any other charged particle beam device such as a scanning ion microscope (SIM) that irradiates an ion beam and detects secondary electrons or reflected electrons, or an ion microscope that uses an ion beam of a light element. Embodiments to be described below can be appropriately combined without a departure from the scope of the present invention.

First Embodiment

Figure 1:
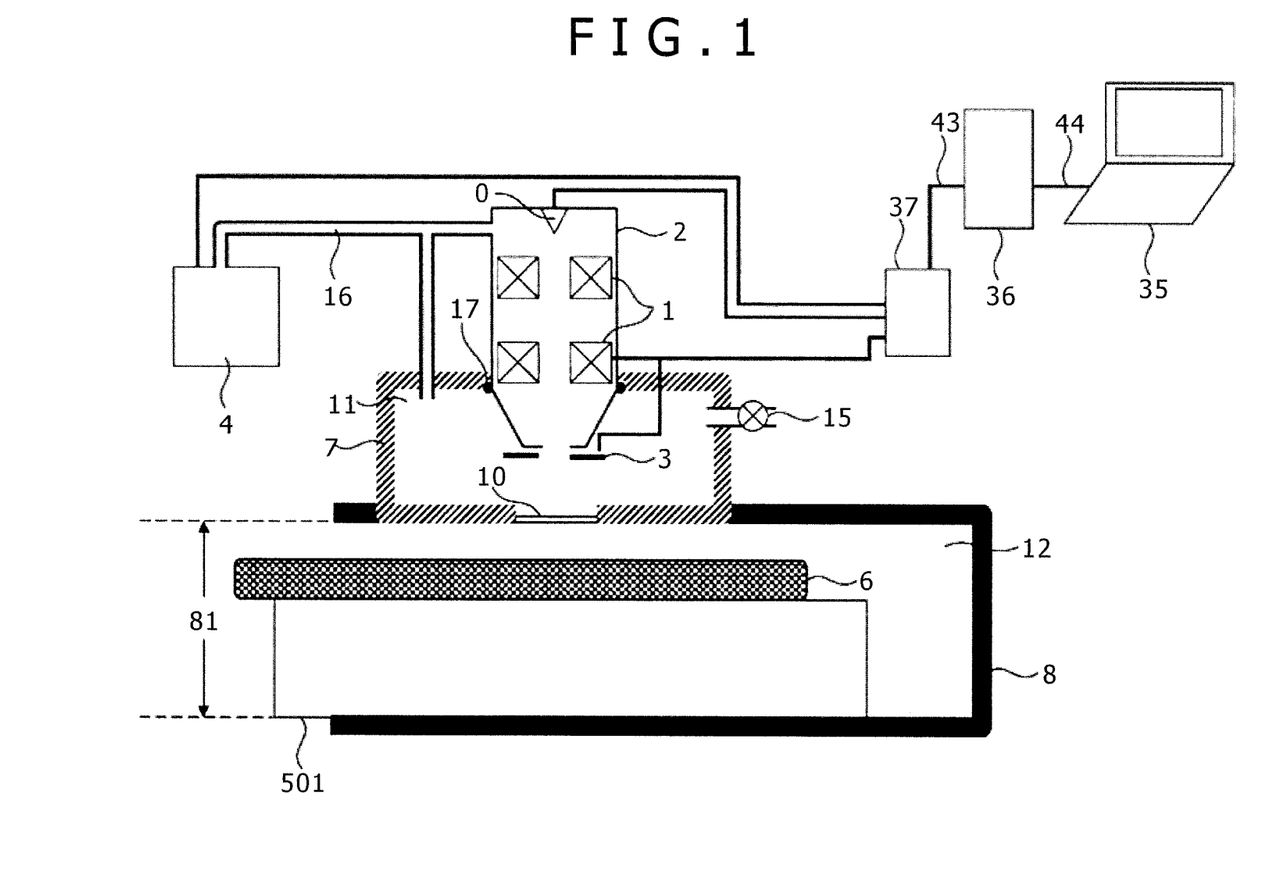
FIG. 1 is an overall configuration diagram of a charged particle beam device in accordance with a first embodiment.

FIG. 1 shows an overall configuration of a charged particle device of the present embodiment. The device shown in FIG. 1 is a scanning microscope that sweeps a charged particle beam over a specimen 6, and detects resultant secondary electrons or reflected electrons for the purpose of imaging. Broadly, the charged particle device includes an electron optical lens barrel 2, a first housing 7 that bears the electron optical lens barrel 2, a second housing 8 in which an object-of-observation specimen is stored, and a thin film 10 that is formed in the bottom of the first housing 7 and that transmits a primary electron beam. The electron optical lens barrel 2 is disposed to jut out to inside the first hosing 7, and a detector 3 that detects the secondary electrons or reflected electrons is disposed at the end of the electron optical lens barrel 2. In the example of the configuration shown in FIG. 1, the detector 3 is incorporated in the first housing 7. Alternatively, the detector 3 may be incorporated in the electron optical lens barrel 2 or second housing 8.

In place of the thin film 10, a through hole which transmits the primary electron beam may be formed in the bottom of the first housing 7. A dot-dash line in the drawing indicates a primary-electron beam ray axis, and the electron optical lens barrel 2, first housing 7, and thin film 10 are assembled coaxially with the primary-electron beam ray axis.

Included as a control system for the device are a personal computer 35 to be used by a device user, an upper-level control unit 36 that is connected to the personal computer 35 and communicates with the personal computer, and a lower-level control unit 37 that controls an evacuation system or electron optical system according to an instruction sent from the upper-level control unit 36. The personal computer 35 includes a monitor on which an operating screen image (GUI) for the device is displayed, and an input means for the operating screen image such as a keyboard and mouse. The upper-level control unit 36, lower-level control unit 37, and personal computer 35 are interconnected over communication lines 43 and 44. The lower-level control unit 37 is a region that transmits or receives a control signal for controlling an evacuation pump 4, a gas control valve 101, an electron source 0, or optical lenses 1. Further, the lower-level control unit 37 converts an output signal of the detector 3 into a digital image signal, and transmits the digital image signal to the upper-level control unit 36. An analog circuit and digital circuit may coexist in the upper-level control unit 36 or lower-level control unit 37, and the upper-level control unit 36 and lower-level control unit 37 may be unified. The configuration of the control system shown in FIG. 1 is a mere example. A variant of the control units, valve, evacuation pump, or communication wiring belongs to the category of an SEM or charged particle beam device of the present embodiment as long as the variant meets a capability intended by the present embodiment.

The electron optical lens barrel 2 internally stores an electron optical system. The electron optical system includes the electron source 0 that emits a primary electron beam, the various optical lenses 1 that control the trajectory of the electron beam, and various deflectors that deflect the trajectory of the electron beam. If the device is an SIM or ion microscope, the electron optical lens barrel 2 and electron optical system are read for a charged particle optical lens barrel and charged particle optical system respectively, and the electron source is read for an ion source. The various optical lenses and various deflectors are realized with electrostatic lenses and electrostatic deflectors respectively. This is because in the case of the ion beam, if magnetic field type lens and deflectors are used, mass separation takes place.

The interiors of the electron optical lens barrel 2 and first housing (strictly speaking, a closed space formed with the surface of the first housing 7 and that of the electron optical lens barrel 2) are evacuated by the evacuation pump 4 during at least operation of the device, and is thus sustained in a state in which the pressure is lower than the atmospheric pressure. Therefore, a joint of the first housing 7 with the electron optical lens barrel 2 is provided with a vacuum sealing member 17. In contrast, the second housing 8 has an opening 81 (or an open surface) through which the interior thereof is opened to the air. During observation of a specimen, the interior of the second housing 8 is always brought to an open-to-air state.

Hereinafter, the internal spaces of the second housing 8 and first housing 7 respectively may be called a first space 12 and second space 11 respectively. The second space 11 has a route of a primary electron beam that has not passed through the thin film 10, and the first space 12 has a route of the primary electron beam that has passed through the thin film 10.

In FIG. 1, the one evacuation pump 4 evacuates the interiors of the electron optical lens barrel 2 and first housing 7 respectively. Alternatively, two or more vacuum pumps may be included in order to independently exhaust the electron optical lens barrel 2 and first housing 7. A pipe 16 is joined to each of the electron optical lens barrel 2 and first housing 7. Alternatively, separate pipes may be joined to the electron optical lens barrel 2 and first housing 7 respectively.

The first housing is provided with a leak valve 15 so that the first housing 7 can be opened to the air when the device is stopped. A disposed position of the leak valve in the first housing 7 is not especially specified. Two or more leak valves 15 may be included, and the leak valve may not necessarily be included.

If a through hole is formed in place of the thin film 10, the area of the through hole is preferably equal to or smaller than 1 mm$^2$. The area of the through hole has to be equal to or smaller than about 1 mm$^2$ in order to realize differential exhaust with a vacuum pump that can be utilized in reality, such as, a turbo molecular pump or rotary pump. Since the second housing 8 and first housing are differentially exhausted, vacuum pumps that exhaust the electron optical lens barrel 2 and first housing respectively should be independently included.

If a thin film other than a through hole is included, the thickness of the thin film has to be equal to or smaller than 20 μm. This is because when an electron gun that needs an accelerating voltage of about several tens of kilovolts and is in practice employed in an SEM is adopted, the thickness which transmits an electron beam is about 20 μm.

A specimen 6 is placed on a stage 501 and stored in the second housing 8. The stages 501 of various thicknesses are available. An appropriate stage is selected according to the thickness of a specimen to be observed, and stored in the second housing 8. The work is needed to be performed manually. However, owing to the work, the distance between the thin film 10 and the surface of the specimen to be observed can be adjusted to be set to an appropriate value.

Since the second housing 8 has the opening 81, even a large-sized specimen that comes out of the housing as shown in FIG. 1 can be put in the housing. In addition, since the second housing 8 is always opened to the air, a hand can be inserted into the housing through the opening 81 even during SEM observation. By moving the stage 501, the observed position of the specimen 6 can be changed during SEM observation.

In the case of an existing atmospheric pressure SEM, it is very hard to change the observed position of a specimen during observation. For example, in the case of the environmental cell described in the patent literature 1, an object-of-observation specimen is retained in the cell having the electron beam passage aperture. If the cell is moved, not only the included specimen but also the aperture which transmits an electron beam is moved. Therefore, in the case of the environmental cell method, only a specific position of a specimen can be observed. In the case of the atmospheric pressure SEM described in the patent literature 2, a specimen is disposed to be in contact with a thin film. If the specimen is moved during observation, there is a risk that the thin film may be damaged and the vacuum of an electron optical system may be broken. Therefore, it is hard to change the observed position of the specimen during observation.

According to the present embodiment, an atmospheric pressure SEM permitting observation of even a large specimen that is too large to be accommodated by the vacuum second housing of an ordinary SEM can be realized. In addition, an SEM or charged particle beam device making it possible to change an observed position of a specimen without the necessity of changing the transmitting position of a charged particle beam can be realized.

Second Embodiment

In the case of an atmospheric pressure SEM, since a space between a thin film and a specimen is retained in the air atmosphere or any gaseous atmosphere, an electron beam is scattered. Therefore, in order to produce an excellent image, the distance between the specimen and thin film should preferably be as short as possible. However, if the distance between the thin film and specimen is too short, there arises a risk that the thin film may be damaged.

In the case of the environmental cell described in the patent literature 1 and mentioned as the related art, the distance between the aperture of the cell and the surface of a specimen retained in the cell cannot be controlled during observation. The size of the specimen to be retained in the cell has to be adjusted to be small. The atmospheric pressure SEM described in the patent literature 2 has a precondition that the specimen should be disposed in contact with the thin film. The thin film has to be replaced with a new one for every observation.

In the first embodiment, the distance between the specimen and thin film is adjusted by changing the thickness of the stage 501 to be put in the second housing. Needless to say, if the distance can be more precisely adjusted, it is more advantageous in terms of observation.

In the present embodiment, a description will be made of the configuration of an atmospheric pressure SEM making it possible to more precisely adjust the distance between a specimen and a thin film using a Z stage and a distance measuring means.

Figure 2:
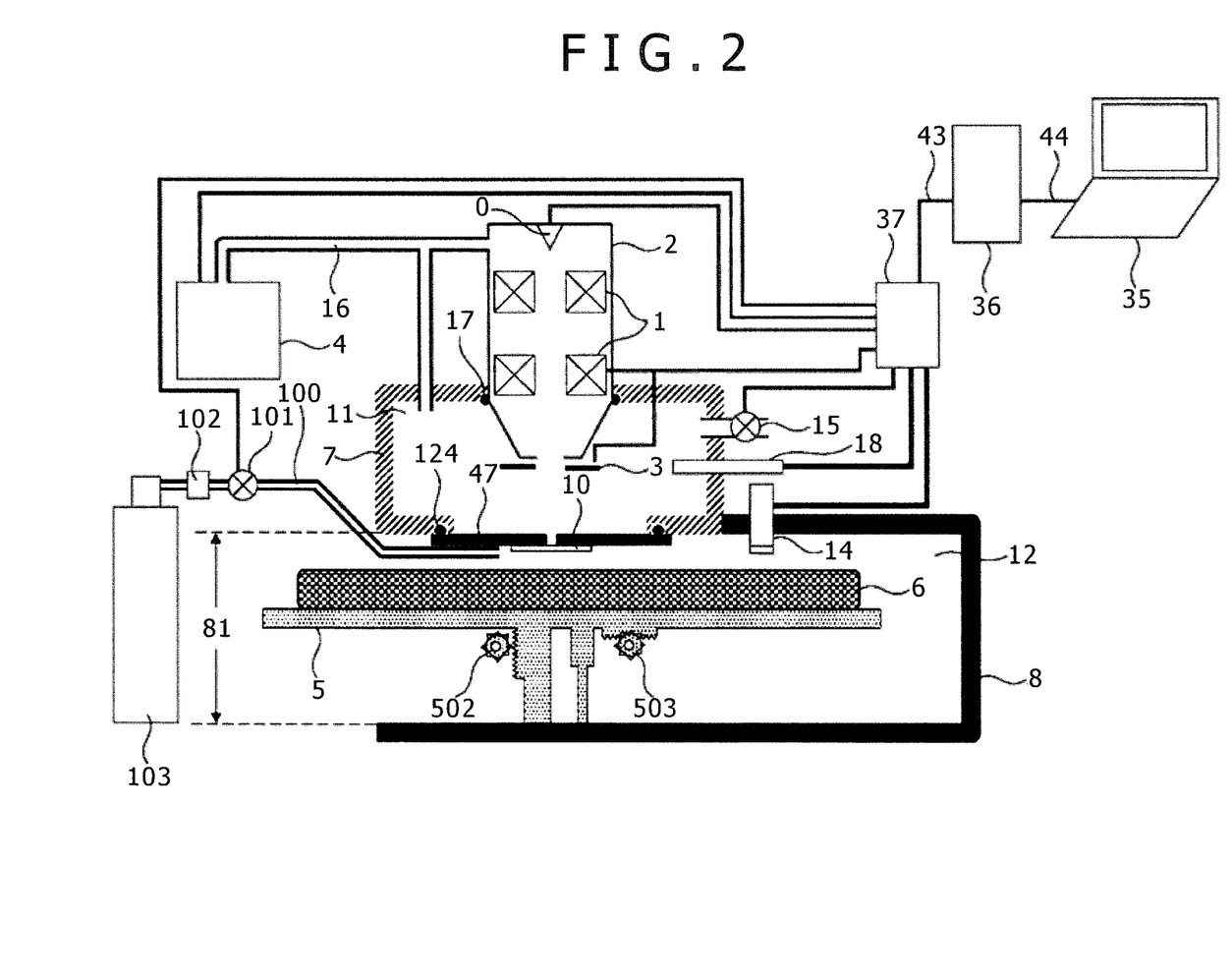
FIG. 2 is an overall configuration diagram of a charged particle beam device in accordance with a second embodiment.

FIG. 2 shows an overall configuration of a charged particle device in accordance with the present embodiment. The device configuration shown in FIG. 2 has a lot in common with the device configuration shown in FIG. 1. A description of the common parts will be omitted, but a difference alone will be described below.

An SEM shown in FIG. 2 includes, similarly to that shown in FIG. 1, the electron optical lens barrel 2, the first housing 7 that bears the electron optical lens barrel 2, the second housing 8 in which an object-of-observation specimen is stored, and various control systems similar to those in FIG. 1. In the case of the SEM of the present embodiment, the thin film 10 is attached to the bottom of the first housing 7 via a thin-film support member 47. For joining the thin-film support member 47 and thin film 10, any means may be employed as long as the means can achieve vacuum sealing. For example, a vacuum sealing member such as an O ring may be employed, or an organic material such as an adhesive or a tape may be employed. Similarly to the embodiment 1, an appropriate plate member having a through hole may be substituted for the thin film 10.

An annular opening is formed in the bottom of the first housing 7, and the thin-film support member 47 is attached to cover the opening from outside the first housing 7. The first housing 7 and electron optical lens barrel 2 are evacuated by an evacuation pump 4, and the vacuum seal of the first housing 7 is sustained by an O ring disposed on the margin of the opening. Therefore, the thin-film support member 47 is attachable or detachable to or from the first housing 7. The thin film 10 is so thin that handling is quite hard to do. After attaching the thin film 10 to the thin-film support member 47 is achieved outside the device, the thin-film support member 47 provided with the thin film 10 is attached to the first housing 7. This makes it very easy to achieve replacement. In case the thin film 10 is damaged, the thin film 10 is replaced with a new one together with the thin-film support member 47.

The SEM of the present embodiment includes a specimen stage that retains an object-of-observation specimen in the second housing 8 and achieves positional driving. The specimen stage includes a stage 5 on which a specimen 6 is placed, a Z driving mechanism 502, and an XY driving mechanism 503. The specimen 6 is carried into the second housing 8 through an opening 81. The second housing 8 is provided with a position measuring instrument 14, whereby a height of a specimen surface and a position in a planar direction can be detected. As the position measuring instrument 14, for example, an optical distance meter can be used. As a type of light, visible light, infrared light, laser light, or the like can be adopted. A result of measurement by the position measuring instrument 14 is transmitted to the personal computer 35 via the lower-level control unit 37 and upper-level control unit 36, and displayed on a monitor. A device user manipulates the Z driving mechanism 502 while looking at the result of measurement displayed on the monitor, and thus moves the specimen 6 close to the thin film 10 to such an extent that the specimen surface does not come into contact with the thin film 10. The SEM shown in FIG. 2 is designed to manually shift the specimen while manipulating the Z driving mechanism 502. Alternatively, the device may be designed so that the Z driving mechanism 502 is provided with a motor or an actuator and a shifting quantity of the Z driving mechanism 502 can be manipulated through a GUI on the monitor.

Owing to the foregoing configuration, an SEM capable of more precisely controlling the distance between the thin film 10 and specimen 6 than that of the first embodiment, that is, an SEM making it possible to move the specimen 6 more closely to the thin film 10 can be realized. Therefore, according to the present embodiment, an SEM capable of acquiring an SEM image with a higher resolution than that of the first embodiment can be realized.

The SEM of the present embodiment includes a gas nozzle 100 making it possible to release a gas, the mass of which is lighter than that of the air, to near a primary electron beam irradiation position of the specimen. The gas nozzle 100 is linked to a gas cylinder 103, which is filled with the light-element gas, by way of a pipe. In the middle of the pipe, a gas control valve 101 and a junction 102 are disposed. Normally, the gas cylinder 103 is not a component of the SEM, but a device user connects the gas cylinder 103 ex post facto. The SEM may be sold with the gas cylinder 103 incorporated therein.

A primary electron beam having passed through the thin film 10 or a through hole enters the second housing 8. The interior of the second housing 8 is sustained under the atmospheric pressure or in a low vacuum state. Therefore, the primary electron beam having entered the second housing is scattered with gaseous molecules of nitrogen or oxygen, and the mean free path of the primary electron beam is shorter than that in the first housing 7. If the mean free path is shorter than the distance between the thin film 10 and the surface of the specimen 6, the electron beam may not reach the specimen, and SEM observation cannot be achieved.

The larger the mass of a gaseous molecule that is a cause of scattering is, the shorter the mean free path of an electron beam is. Therefore, if the route of a primary electron beam in the second housing 8 is filled with gaseous molecules the mass of which is lighter than that of nitrogen or oxygen that is a major element included in the air, the mean free path can be made longer than that in the air atmosphere. Therefore, the SEM of the present embodiment includes the gas nozzle 100, and a light-element gas such as a hydrogen gas, helium gas, methane gas, or water vapor is released near the primary electron beam irradiation position of the specimen. Accordingly, a probability that the primary electron beam having entered the second housing 8 reaches the specimen gets higher. Eventually, a quantity of reflected electrons or secondary electrons released from the specimen can be increased, and a probability that the reflected electrons or secondary electrons are scattered in the second housing 8 can be lowered. As a result, a probability that the reflected electrons or secondary electrons reach the detector 3 gets higher, and the image quality of an acquired SEM image improves.

The SEM of the present embodiment has, in addition to the detector 3, an EDX detector 18 incorporated in the first housing 7, and can therefore achieve material analysis of a specimen to be observed. Aside from the EDX detector, a fluorescence line detector may be included. When a primary electron beam is irradiated to the specimen 6, an absorption current flows into the specimen. If a current flowing from the specimen 6 into the stage is measured, an image based on the absorption current (or absorbed electrons) can be acquired. For this purpose, an ammeter is included in the lower-level control unit 37, and a specimen placement surface of the stage 5 is made of a conducting material so that the stage 5 has a current detection capability.

Next, a device operation screen image in the SEM of the present embodiment will be described below in conjunction with FIG. 3 and FIG. 4.

Figure 3:
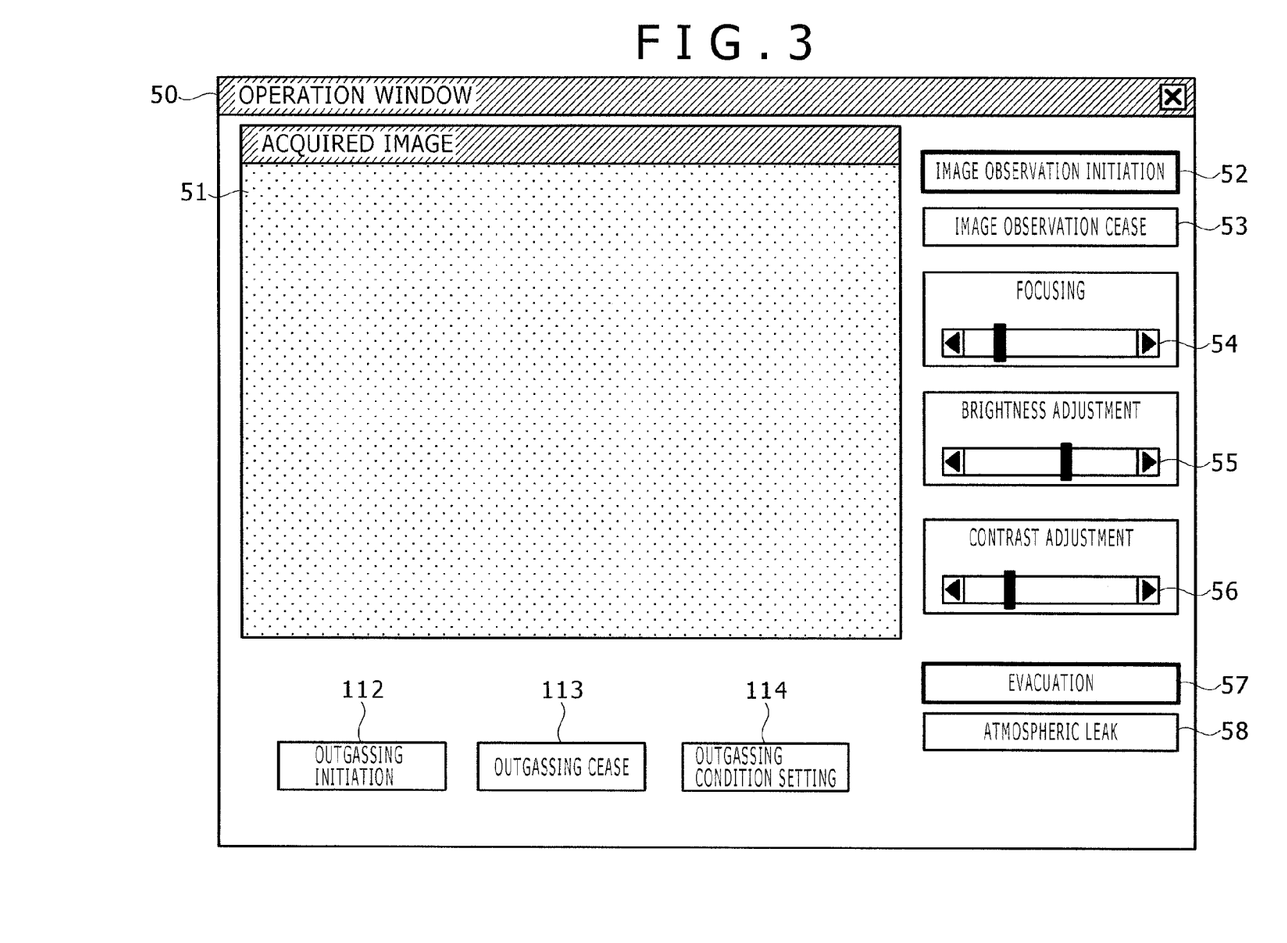
FIG. 3 is a diagram showing a layout example of an operation screen image employed in the charged particle beam device of the second embodiment.
Figure 4:
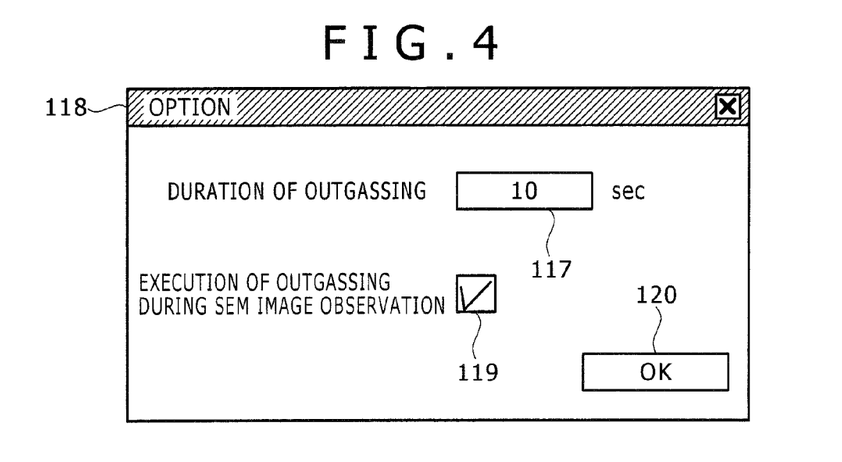
FIG. 4 is a diagram showing a layout example of an operation screen image employed in the charged particle beam device of the second embodiment.

In an operation screen image shown in FIG. 3, there are, for example, an operation window 50, an image display section 51, an image observation initiation button 52 for initiating emission of an electron beam so as to begin image display, an image observation cease button 53 for ceasing the emission of an electron beam so as to halt the image display, a focusing button 54 for adjusting optical lenses, which include a deflection lens and objective lens, so as to execute automatic focusing, a brightness adjustment button 55 for adjusting the brightness of an image, a contrast adjustment button 56 for adjusting a contrast, an evacuation button 57 for initiating evacuation of the interior of the charged particle optical lens barrel 2 or the first housing 7, and an atmosphere leak button 58 for leaking the interior of the first housing 7 to the air. When the evacuation button 57 is clicked in the screen image, evacuation is initiated. When the evacuation button 57 is clicked again, the evacuation is ceased. The same applies to the atmosphere leak button 58. Processing to be executed by manipulating any of the buttons can be executed by manipulating a mechanical button or knob of a device main unit.

In the operation window 50, there are an outgassing initiation button 112 for opening the gas control valve 101 so as to release a gas through the gas nozzle, and an outgassing cease button 113 for closing the gas control valve 101 so as to cease outgassing.

In the case of the present embodiment, there is a possibility that after the outgassing initiation button 112 is depressed, if the outgassing cease button 113 is forgotten to be depressed, the gas control valve 101 may be left open and the gas cylinder 103 may be emptied. An outgassing condition setting button 114 shown in FIG. 3 is depressed, an outgassing condition setting window 118 shown in FIG. 4 opens, and an outgassing condition such as whether execution of outgassing is needed or an outgassing duration can be set. If a time during which outgassing should be continued is entered in an outgassing time setting box displayed in the window, after the outgassing initiation button 112 is clicked, outgassing is continued during the entered time. When the time has elapsed, the outgassing is automatically ceased. The duration of outgassing may not be set in another window like the one shown in FIG. 4, but may be stored as a fixed value in the upper-level control unit 36 or lower-level control unit 37. The device may be designed so that after the outgassing initiation button 112 is clicked, when a certain time has elapsed, outgassing is forcibly ceased.

When an SEM image is observed, outgassing may have to be performed without fail. In this case, once a check mark is entered in an outgassing execution check box 119 shown in FIG. 4, when an image observation initiation button 52 is clicked, the gas control valve 101 is automatically opened while being interlocked with the click. By clicking the image observation cease button 53, the gas control valve 101 is automatically closed. At this time, if a numerical value is set in an outgassing time setting box 117, when the set time has elapsed, the gas control valve 101 is closed. The control is executed by the lower-level control unit 37. Even when an interlocking feature for the image observation initiation and outgassing initiation is employed, the outgassing initiation button 112 and outgassing cease button 113 shown in FIG. 3 are valid. Once the outgassing cease button 113 is clicked, outgassing initiated by the interlocking feature can be ceased.

Third Embodiment

The present embodiment will be described in relation to an example of the configuration of an SEM having a restriction member, which restricts a thin film-specimen distance for fear the object-of-observation specimen and thin film approach so closely that a distance, which is equal to or larger than a certain value, cannot be preserved between them, included in an opposite-to-specimen surface of the thin film which transmits or passes a primary electron beam.

Figure 5:
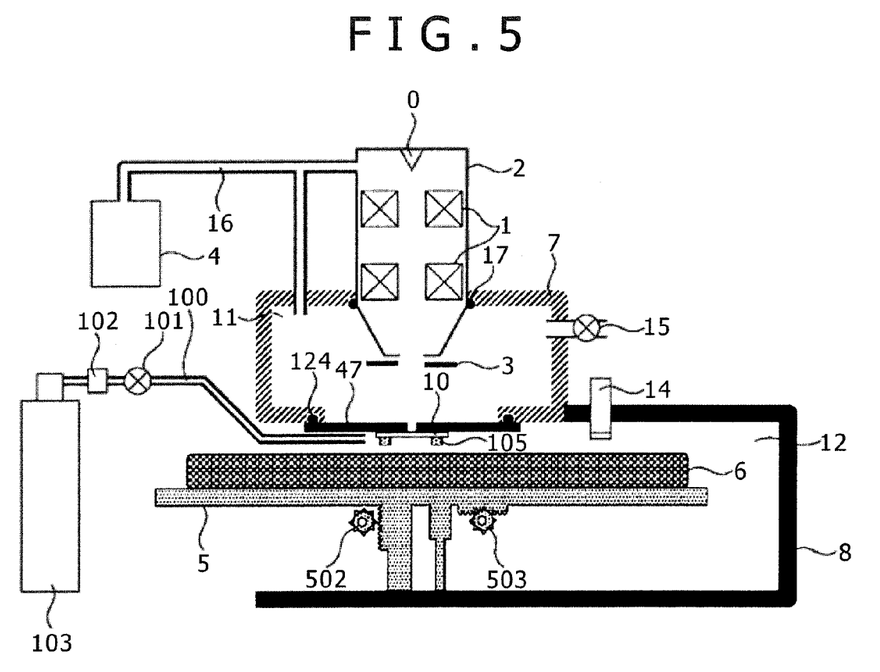
FIG. 5 is an overall configuration diagram of a charged particle beam device in accordance with a third embodiment.

FIG. 5 is a schematic diagram showing the configuration of an SEM in accordance with the present embodiment. For brevity's sake, a control system is omitted. In reality, similarly to those shown in FIG. 1 and FIG. 2, pieces of control means for controlling an electron optical system or evacuation system are included.

A thin film-specimen distance is preferably as short as possible irrespective of the atmosphere on a route of a primary electron beam. However, if a thin film and specimen approach, a probability that the thin film may be damaged gets higher. In particular, when a type of thin film that transmits an electron beam is adopted, this problem is serious.

In order to solve the problem, a restriction member 105 that prevents the thin film and specimen from coming into contact with each other should be, as shown in FIG. 5, disposed on the side of an opposite-to-specimen surface of the thin film 10. As the restriction member 105, anything may be adopted as long as it can restrict the distance between the specimen and thin film. Simply, an adhesive or tape may be applied or bonded to the opposite-to-specimen surface side of the thin film 10, and used as the restriction member 105. However, in consideration of the mean free path of a primary electron beam having passed through the thin film 10, the restriction member 105 is preferably made of a thin-film material whose thickness is accurately known. In FIG. 5, the restriction member 105 is attached to the thin film 10. Alternatively, the restriction member 105 may be attached to the thin-film support member 47 or stage 5. Otherwise, the restriction member 105 may be placed over the specimen 6. Further, the restriction member 105 may be attachable and detachable.

When the distance between a thin film and a specimen is decreased, a resolution rises. Therefore, preferably, a very thin restriction member 105 should be attached. However, a high resolution is not needed for some specimens. In this case, a restriction member 105 having a thickness of a certain level should be substituted. The restriction member having the thickness of a certain level can diminish the possibility of damaging the thin film. Therefore, making the restriction member 105 attachable or detachable is advantageous.

Since the restriction member 105 is disposed as mentioned above, the thin film can be prevented from being damaged in case a specimen is moved too closely to the thin film due to an erroneous manipulation.

Fourth Embodiment

Figure 6:
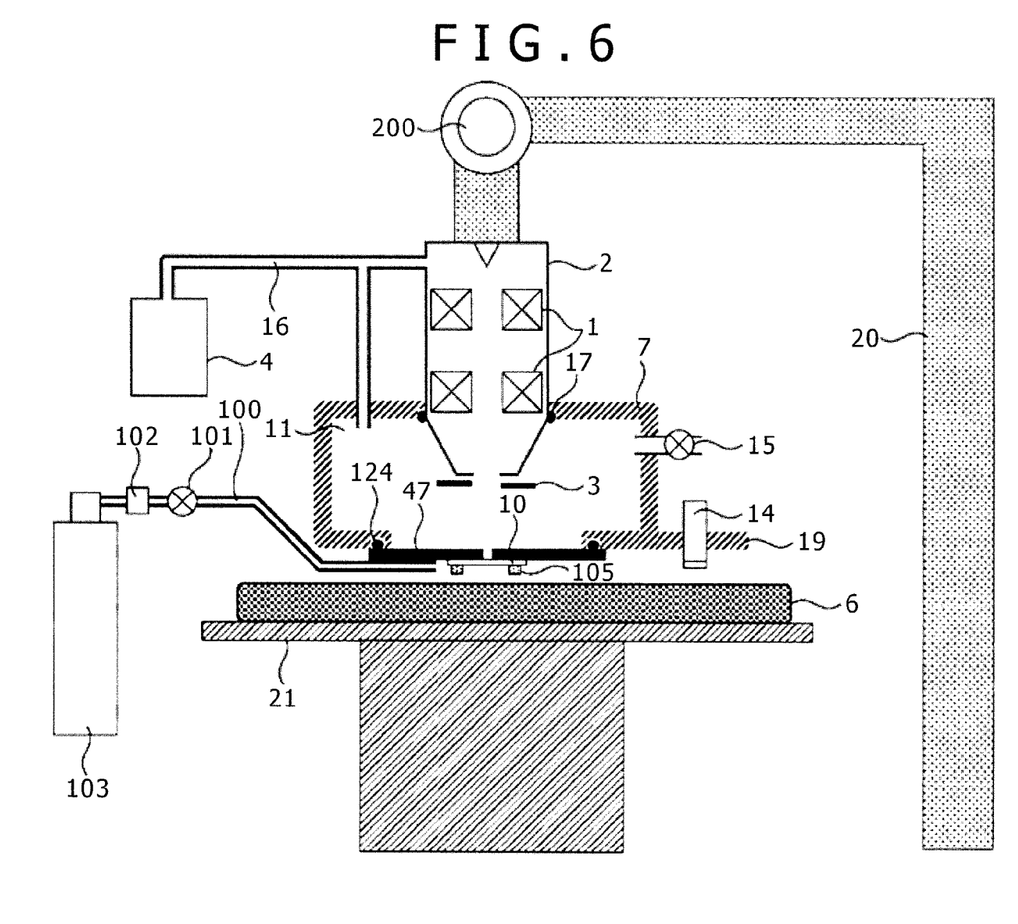
FIG. 6 is an overall configuration diagram of a charged particle beam device in accordance with a fourth embodiment.

In the present embodiment, an example of the configuration of an SEM including a mechanism that changes a thin film-specimen distance will be described below. The SEMs described in relation to the embodiments 2 and 3 respectively adjust the thin film-specimen distance by shifting a specimen with a Z stage. In the present embodiment, an upper structure of the SEM including the electron optical lens barrel 2 and a second mirror body is made movable in order to adjust the thin film-specimen distance.

FIG. 6 shows an overall structure of the SEM of the present embodiment. Similarly to FIG. 5, various control systems are omitted. In the SEM of the present embodiment, a driving mechanism 200 is disposed above the electron optical lens barrel 2. The driving mechanism 200 moves the electron optical lens barrel 2 and first housing 7 in vertical directions, whereby a relative distance of the thin film 10 with respect to the specimen 6 placed over a stage 21 is adjusted. For collision prevention, the restriction member 105 is disposed on the opposite-to-specimen surface side of the thin film 10. Further, the position measuring instrument 14 is disposed in a flange 19 jutting out from the bottom of the first housing 7. The thin film 10 is attached to the thin-film support member 47, and is attachable or detachable with respect to the first housing 7.

In the structure shown in FIG. 6, the vacuum pump 4 and pipe 16 are movable while being interlocked with the electron optical lens barrel 2 and first housing 7. A sliding member having a vacuum sealing capability may be interposed between the pipe 16 and the electron optical lens barrel 2 and between the pipe 16 and the first housing 7, so that the vacuum pump 4 and pipe 16 are not moved when the driving mechanism 200 is operated.

In the SEM of the present embodiment, since the electron optical lens barrel 2 and first housing 7 are borne by a post 20, a second housing serving as a feature member that bears the entire device including the electron optical lens barrel 2 and first housing 7 is unnecessary. Therefore, the SEM having the structure of the present embodiment is suitable for a case where a large-sized specimen is not cut but observed as it is. Otherwise, the SEM is suitable for a case where a very large stage such as a belt conveyer is included.

Figure 7:
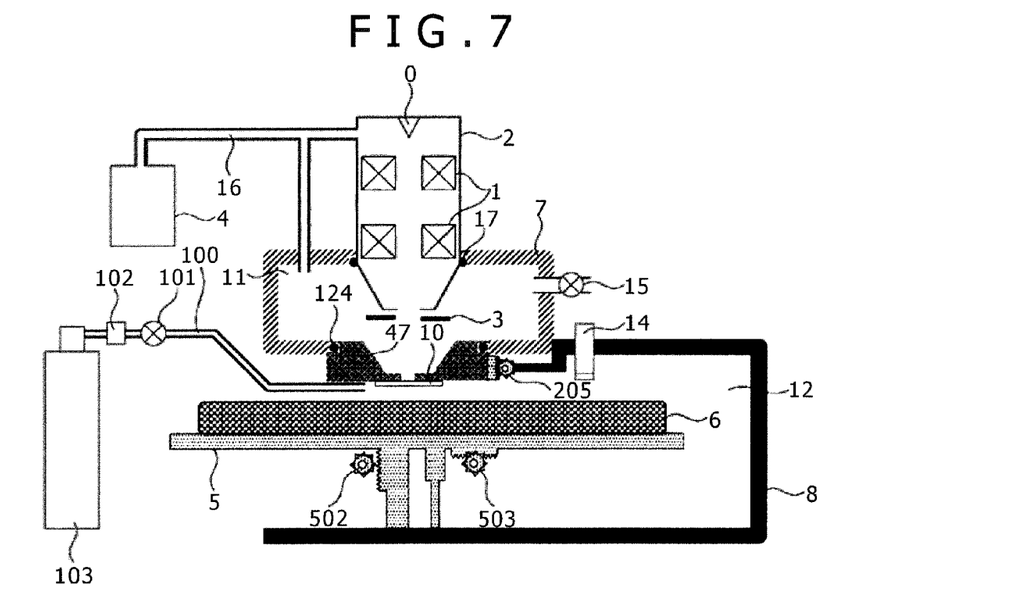
FIG. 7 is a diagram showing a variant of the charged particle beam device of the fourth embodiment.

FIG. 7 shows another variant of an SEM including a mechanism that changes a thin film-specimen distance. In an SEM shown in FIG. 7, the thin-film support member 47 is provided with a sliding ability with respect to the first housing 7, and is made movable using a driving mechanism 201. A vacuum seal between the thin-film support member 47 and first housing 7 is realized with a vacuum sealing mechanism 124. The vacuum sealing mechanism 124 has to exhibit the sliding ability.

The SEM shown in FIG. 7 can adjust the thin film-specimen distance using both the Z driving mechanism 502 and driving mechanism 201. For example, when Z driving of a specimen has to be coarsely performed, the Z driving mechanism 502 is employed. When the Z driving has to be finely performed, the driving mechanism 201 is employed.

In order to shorten a distance from the objective lens of the SEM to a specimen, that is, a focal length, the Z driving mechanism 502 is used to move the specimen close to the thin film 10. In order to extend the focal length, the driving mechanism 201 is used to move the thin film close to the specimen.

In such a structure that the specimen 6 is on board a belt conveyer, it may be hard to provide the belt conveyer with the Z driving mechanism 502. In this case, the driving mechanism 201 that drives the thin film side as shown in FIG. 7 would prove very useful.

In case the specimen 6 is very large and the device shown in FIG. 7 is very small, it may be quite hard to move the specimen 6 itself. In this case, preferably, the position of the specimen 6 is fixed, and the thin film side is driven in order to move the thin film 10 close to the specimen.

Fifth Embodiment

Figure 8:
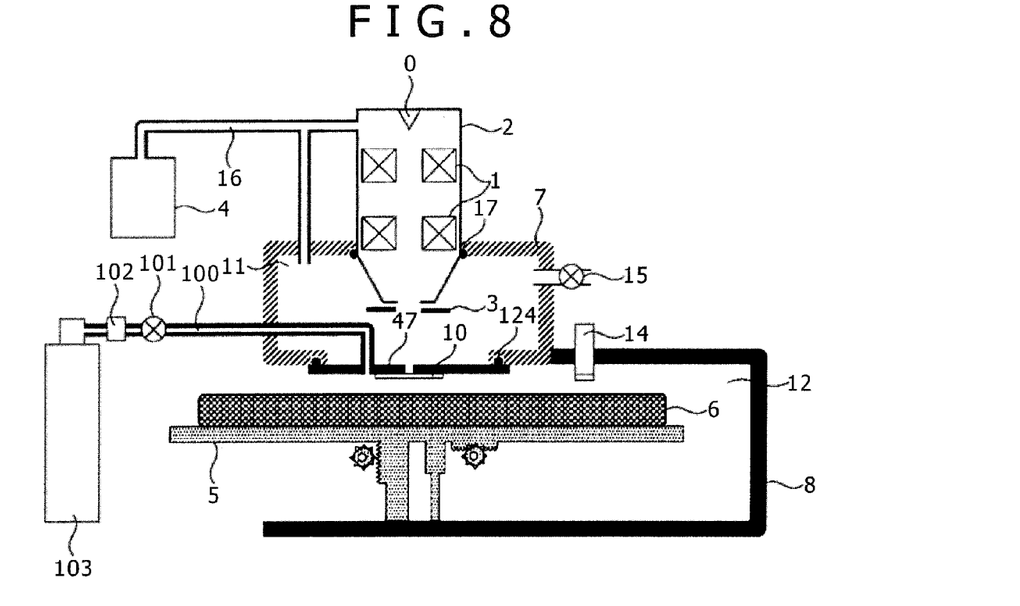
FIG. 8 is an overall configuration diagram of a charged particle beam device in accordance with a fifth embodiment.

FIG. 8 shows a variant of the disposition of a gas nozzle that feeds a light-element gas to an observed position. In the aforesaid embodiments, the gas nozzle 100 is disposed over the bottom of the first housing 7, and introduced from the opening 81 of the second housing 8 or the lateral side of the bottom of the first housing 7. In the present embodiment, a pipe is introduced into the first housing 7, and the nozzle is inserted into the thin-film support member 47. Thus, the light-element gas is fed from the side of the thin-film support member 47 to a specimen surface. The gas nozzle can be inserted into the thin film 10 itself. There is a high possibility that the thin film 10 is damaged at the time of detaching the thin-film support member 47. Therefore, the gas nozzle should be inserted into the thin-film support member 47.

In the present embodiment, an extra structure is not interposed between the thin film 10 and specimen 6. Compared with the SEMs of the embodiments, the thin film-specimen distance can be made shorter in order to perform SEM observation. Needless to say, a restriction member may be included for collision prevention.

LIST OF REFERENCE SIGNS

0: electron source
1: optical lens
2: electron optical lens barrel
3: detector
4: evacuation pump
5, 21: stage
6: specimen
7: first housing
8: second housing
10: thin film
11: second space
12: first space
14: position measuring instrument
15: leak valve
16: pipe
17: vacuum sealing member
18: EDX detector
19: flange
20: post
35: personal computer
36: upper-level control unit
37: lower-level control unit
43, 44: communication line
47: thin-film support member
50: operation window
51: image display section
52: image observation initiation button
53: image observation cease button
54: focusing button
55: brightness adjustment button
56: contrast adjustment button
57: evacuation button
58: atmospheric leak button
81: opening
101: gas control valve
103: gas cylinder
112: outgassing initiation button
113: outgassing cease button
114: outgassing condition setting button
117: outgassing time setting box
118: outgassing condition setting window
119: outgassing execution check box
120: OK button
124: vacuum sealing mechanism

The invention claimed is:

1. A charged particle beam device comprising:
a charged particle optical system that sweeps a primary charged particle beam, which is emitted from a charged particle source, over a specimen;
a charged particle optical lens barrel in which the charged particle optical system is stored;
a detector that detects reflected electrons or secondary electrons resulting from the sweeping;
at least one or more exhaust pumps;
a thin film that transmits or passes the primary charged particle beam, and a thin-film support member that retains the thin film;
a second housing in which the specimen is stored and whose interior is always opened to the air during observation of the specimen through the opening formed on the lateral side;
a stage configured to support the specimen during observation, the stage disposed within the second housing and extending through the opening; and
a first housing which is disposed over the top of the second housing and whose interior is evacuated,
wherein
the detector detects secondary electrons or reflected electrons that pass through the thin film and reach above the thin film.

2. The charged particle beam device according to claim 1, wherein the primary charged particle beam is focused when the charged particle optical system sweeps the primary charged particle beam over the specimen; the charged particle optical lens barrel is positioned on a top surface of the first housing; the first housing supports the charged particle optical lens barrel; the thin film is disposed on a bottom of the first housing; the at least one or more exhaust pumps is connected to the interior of the first housing; the detector is configured to detect reflected electrons or secondary electrons resulting from the sweeping; and the opening of the second housing is configured to allow the specimen to be carried through the opening and into the second housing; and the specimen does not contact the thin film.

3. The charged particle beam device according to claim 2, further comprising a gas nozzle through which a gas is fed to the second housing, wherein the gas whose mass is lighter than that of the air is fed to the second housing through the gas nozzle.

4. The charged particle beam device according to claim 3, wherein the gas released through the gas nozzle contains any of a hydrogen gas, a helium gas, a methane gas, and water vapor.

5. The charged particle beam device according to claim 3, wherein the gas nozzle is attached to the thin-film support member.

6. The charged particle beam device according to claim 3, further comprising:
    a control means that controls a state of outgassing through the gas nozzle; and
    a monitor on which an operation screen image for operating the control means is displayed.

7. The charged particle beam device according to claim 6, wherein a button or entry box for use in entering initiation or cease of outgassing or a duration of outgassing is displayed in the operation screen image.

8. The charged particle beam device according to claim 2, wherein the thin-film support member is attachable or detachable to or from the first housing.

9. The charged particle beam device according to claim 2, wherein the second housing is provided with a measuring means that measures the distance between the thin film and specimen.

10. The charged particle beam device according to claim 2, wherein a stage over which the specimen is laid and a Z stage that shifts the stage in a Z direction are incorporated in the second housing.

11. The charged particle beam device according to claim 2, wherein the thin film or thin-film support member is provided with a restriction member that restricts the distance between the specimen and thin film.

12. The charged particle beam device according to claim 2, wherein at least either the second housing or first housing is provided with a second detector that detects one or more of ions, charged particles, photons, and X rays released from the specimen due to irradiation of the primary charged particle beam.

13. The charged particle beam device according to claim 2, wherein a stage having the capability to detect charged particles or a current which flows into the specimen due to irradiation of the primary charged particle beam is incorporated in the first housing.

14. The charged particle beam device according to claim 2, wherein the thickness of the thin film is equal to or smaller than 20 μm.

15. The charged particle beam device according to claim 2, wherein the thin film has a through hole through which the primary charged particle beam passes and whose area is equal to or smaller than 1 mm$^2$.

16. The charged particle beam device according to claim 2, further comprising:
    an evacuation port on the first housing,
    wherein the interior of the first housing is evacuated through the evacuation port.

17. The charged particle beam device according to claim 2, wherein the charged particle optical lens barrel is disposed to jut out to inside the first housing.

18. The charged particle beam device according to claim 2, wherein a part of the charged particle optical lens barrel is disposed inside the first housing.

19. A microscopy method for sweeping a primary charged particle beam, which is emitted from the end of a charged particle optical lens barrel, over a specimen, and imaging reflected electrons or secondary electrons resulting from the sweeping so as to observe the specimen, wherein:
    the interior of a second housing, in which the specimen is stored and which bears the entire charged particle beam device against a device installation surface, is always opened to the air during observation of the specimen through an opening of the second housing;
    a first route of the primary charged particle beam that exists inside a first housing which is disposed over the top of the second housing and which bears the charged particle optical lens barrel, and that exists between a thin film, which transmits or passes the primary charged particle beam and is disposed away from the end of the charged particle optical lens barrel, and the end is sustained in a vacuum state;
    a gas whose mass is lighter than that of the air is fed to a second route of the primary charged particle beam existent between the thin film and specimen; and
    secondary electrons or reflected electrons, which return to the charged particle optical lens barrel side after being transmitted or passed by the thin film, out of the secondary electrons or reflected electrons resulting from the sweeping are detected in order to observe the specimen.

20. The microscopy method according to claim 19, further comprising focusing the primary charged particle beam when sweeping the primary charged particle beam over the specimen; wherein the opening of the second housing is configured to allow the specimen to be carried through the opening and into the second housing; the thin film is disposed on a bottom of the first housing; and the specimen does not contact the thin film.

21. The microscopy method according to claim 20, wherein the first route is evacuated through an evacuation port on the first housing.

22. The microscopy method according to claim 20, wherein the charged particle optical lens barrel is disposed to jut out to inside the first housing.

23. The microscopy method according to claim 20, wherein a part of the charged particle optical lens barrel is disposed inside the first housing.

* * * * *